US008697578B2

(12) United States Patent
Nodera et al.

(10) Patent No.: US 8,697,578 B2
(45) Date of Patent: Apr. 15, 2014

(54) FILM FORMATION APPARATUS AND METHOD FOR USING SAME

(75) Inventors: Nobutake Nodera, Nirasaki (JP); Jun Sato, Nirasaki (JP); Kazuya Yamamoto, Nirasaki (JP); Kazuhide Hasebe, Nirasaki (JP)

(73) Assignee: Tokyo Electron Limited, Tokyo-To (JP)

( * ) Notice: Subject to any disclaimer, the term of this patent is extended or adjusted under 35 U.S.C. 154(b) by 1129 days.

(21) Appl. No.: 12/285,575

(22) Filed: Oct. 8, 2008

(65) Prior Publication Data

US 2009/0124083 A1 May 14, 2009

(30) Foreign Application Priority Data

Oct. 16, 2007 (JP) ................................. 2007-268722

(51) Int. Cl.
*H01L 21/311* (2006.01)

(52) U.S. Cl.
USPC ............ 438/694; 438/706; 438/784; 134/1.1; 134/26; 134/22.1; 134/902

(58) Field of Classification Search
USPC ............ 438/694, 706, 784; 134/1.1, 26, 22.1, 134/902
See application file for complete search history.

(56) References Cited

U.S. PATENT DOCUMENTS

| 7,494,943 | B2 | 2/2009 | Noro et al. | |
|---|---|---|---|---|
| 7,938,080 | B2 | 5/2011 | Noro et al. | |
| 2001/0027030 | A1* | 10/2001 | Vasudev et al. | 438/784 |
| 2004/0025786 | A1* | 2/2004 | Kontani et al. | 118/715 |
| 2006/0081182 | A1* | 4/2006 | Okada et al. | 118/715 |
| 2006/0124058 | A1 | 6/2006 | Sakai et al. | |
| 2006/0207630 | A1* | 9/2006 | Sakai et al. | 134/1.1 |
| 2007/0017445 | A1* | 1/2007 | Takehara et al. | 118/719 |
| 2009/0176017 | A1 | 7/2009 | Sakai et al. | |
| 2011/0300722 | A1 | 12/2011 | Sakai et al. | |

FOREIGN PATENT DOCUMENTS

| CN | 1958878 A | 5/2007 | |
|---|---|---|---|
| JP | 3-293726 | 12/1991 | |
| JP | 2005-286005 | * 10/2005 | ............ H01L 21/205 |
| JP | 2006-287228 | 10/2006 | |
| JP | 2007-142469 | 6/2007 | |
| WO | 2004/044970 | 5/2004 | |

OTHER PUBLICATIONS

Chinese Office Action issued on May 4, 2011 for Application No. 200810167961.6 with English translation.
Korean Office Action issued on Jul. 20, 2011 for Application No. 10-2008-0100906 w/ English language translation.
Chinese Office Action mailed on Apr. 12, 2012 for Application No. 200810167961.6 w/ English translation.

* cited by examiner

*Primary Examiner* — Duy Deo
*Assistant Examiner* — Mahmoud Dahimene
(74) *Attorney, Agent, or Firm* — Smith, Gambrell & Russell, LLP

(57) ABSTRACT

A method for using a film formation apparatus for a semiconductor process to form a thin film on a target substrate while supplying a film formation reactive gas from a first nozzle inside a reaction chamber includes performing a cleaning process to remove a by-product film deposited inside the reaction chamber and the first nozzle, in a state where the reaction chamber does not accommodate the target substrate. The cleaning process includes, in order, an etching step of supplying a cleaning reactive gas for etching the by-product film into the reaction chamber, and activating the cleaning reactive gas, thereby etching the by-product film, and an exhaust step of stopping supply of the cleaning reactive gas and exhausting gas from inside the reaction chamber. The etching step is arranged to use conditions that cause the cleaning reactive gas supplied in the reaction chamber to flow into the first nozzle.

14 Claims, 6 Drawing Sheets

| Nozzle | Gas type | Flow rate (slm) |
|---|---|---|
| Gas distribution nozzle 8 | $N_2$ | 0.5 |
| Gas distribution nozzle 9 | $N_2$ | 0.5 |
| Gas nozzle 10a | $F_2$ | 1 |
| Gas nozzle 10b | HF | 1 |
| Gas nozzle 10c | $N_2$ | 4.5 |

FIG.5

FILM FORMATION APPARATUS AND METHOD FOR USING SAME

BACKGROUND OF THE INVENTION

1. Field of the Invention

The present invention relates to a film formation apparatus for a semiconductor process for forming a thin film, such as a silicon nitride film, on a target substrate, such as a semiconductor wafer, and also to a method for using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon nitride film or silicon oxide film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure inside the reaction tube is decreased to a predetermined pressure.

Then, while the interior of the reaction tube is kept at the predetermined temperature and pressure (kept exhausted), a film formation gas is supplied through a gas supply line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the inner surface of the reaction tube and so forth, a stress is generated and causes peeling of some of the by-product films and the quartz of the reaction tube and so forth due to a difference in coefficient of thermal expansion between the quartz and by-product films. Consequently, particles are generated, and may decrease the yield of semiconductor devices to be fabricated and/or deteriorate some components of the processing apparatus.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube and so forth are thereby dry-etched and removed by the cleaning gas (for example, Jpn. Pat. Appln. KOKAI Publication No. 3-293726). However, as described later, the present inventors have found that conventional methods including a cleaning process for using a film formation apparatus of this kind have room for improvement in terms of some characteristics of the apparatus concerning the downtime and particle generation.

BRIEF SUMMARY OF THE INVENTION

An object of the present invention is to provide a film formation apparatus for a semiconductor process and a method for using the same, which can improve characteristics of the apparatus concerning the downtime and particle generation.

According to a first aspect of the present invention, there is provided a method for using a film formation apparatus for a semiconductor process to form a thin film on a target substrate while supplying a film formation reactive gas from a first nozzle inside a reaction chamber, the method comprising: performing a cleaning process to remove a by-product film deposited inside the reaction chamber and the first nozzle, in a state where the reaction chamber does not accommodate the target substrate, the cleaning process comprising, in order, an etching step of supplying a cleaning reactive gas for etching the by-product film into the reaction chamber, and activating the cleaning reactive gas, thereby etching the by-product film, and an exhaust step of stopping supply of the cleaning reactive gas and exhausting gas from inside the reaction chamber, wherein the etching step is arranged to use conditions that cause the cleaning reactive gas supplied in the reaction chamber to flow into the first nozzle.

According to a second aspect of the present invention, there is provided a method for using a film formation apparatus for a semiconductor process, the film formation apparatus comprising a reaction chamber configured to accommodate a plurality of target substrates at intervals in a vertical direction, a support member configured to support the target substrates inside the reaction chamber, an exhaust system configured to exhaust gas from inside the reaction chamber, a heater disposed around the reaction chamber to heat the target substrates, a first film formation gas supply system configured to supply a first film formation gas containing a silane family gas into the reaction chamber, the first film formation gas supply system including a first gas distribution nozzle with a plurality of gas spouting holes formed thereon at predetermined intervals for supplying the silane family gas, a second film formation gas supply system configured to supply a second film formation gas containing a nitriding gas into the reaction chamber, a plasma generation section attached outside the reaction chamber and forming a plasma generation space that communicates with a process space inside the reaction chamber, the second film formation gas being supplied through the plasma generation space into the process space, and a cleaning gas supply system configured to supply a cleaning reactive gas for etching a by-product film generated by a reaction between the first and second film formation gases, the method comprising: performing a film formation process for forming a silicon nitride film by ALD (atomic layer deposition) on the target substrates inside the reaction chamber, by alternately supplying the silane family gas from the first gas distribution nozzle and the second film formation gas into the reaction chamber while activating the second film formation gas by the plasma generation section; and then, performing a cleaning process to remove a by-product film deposited inside the reaction chamber and the first gas distribution nozzle, in a state where the reaction chamber does not accommodate the target substrates, the cleaning process comprising, in order, an etching step of supplying the cleaning reactive gas into the reaction chamber at a first flow rate while supplying a dilution gas for diluting the cleaning reactive gas from the first gas distribution nozzle into the reaction chamber at a second flow rate smaller than the first flow rate, thereby etching the by-product film while causing the cleaning reactive gas to flow into the first gas distribution nozzle, and an exhaust step of stopping supply of the cleaning reactive gas and exhausting gas from inside the reaction chamber.

According to a third aspect of the present invention, there is provided a film formation apparatus for a semiconductor process, the apparatus comprising: a reaction chamber configured to accommodate a plurality of target substrates at intervals in a vertical direction; a support member configured to support the target substrates inside the reaction chamber; an exhaust system configured to exhaust gas from inside the reaction chamber; a heater disposed around the reaction chamber to heat the target substrates; a first film formation gas supply system configured to supply a first film formation gas containing a silane family gas into the reaction chamber, the first film formation gas supply system including a first gas distribution nozzle with a plurality of gas spouting holes formed thereon at predetermined intervals for supplying the silane family gas; a second film formation gas supply system configured to supply a second film formation gas containing a nitriding gas into the reaction chamber; a plasma generation section attached outside the reaction chamber and forming a plasma generation space that communicates with a process space inside the reaction chamber, the second film formation gas being supplied through the plasma generation space into the process space; a cleaning gas supply system configured to supply a cleaning reactive gas for etching a by-product film generated by a reaction between the first and second film formation gases; and a control section configured to control an operation of the apparatus, the control section being preset to conduct a method that comprises performing a film formation process for forming a silicon nitride film by ALD (atomic layer deposition) on the target substrates inside the reaction chamber, by alternately supplying the silane family gas from the first gas distribution nozzle and the second film formation gas into the reaction chamber while activating the second film formation gas by the plasma generation section; and then, performing a cleaning process to remove a by-product film deposited inside the reaction chamber and the first gas distribution nozzle, in a state where the reaction chamber does not accommodate the target substrates, the cleaning process comprising, in order, an etching step of supplying the cleaning reactive gas into the reaction chamber at a first flow rate while supplying a dilution gas for diluting the cleaning reactive gas from the first gas distribution nozzle into the reaction chamber at a second flow rate smaller than the first flow rate, thereby etching the by-product film while causing the cleaning reactive gas to flow into the first gas distribution nozzle, and an exhaust step of stopping supply of the cleaning reactive gas and exhausting gas from inside the reaction chamber.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given-above and the detailed description of the embodiments given below, serve to explain the principles of the invention.

FIG. 5 is a diagram showing the types and flow rates of gases supplied from respective gas nozzles in the flow step of the cleaning process.

DETAILED DESCRIPTION OF THE INVENTION

Figure 1:
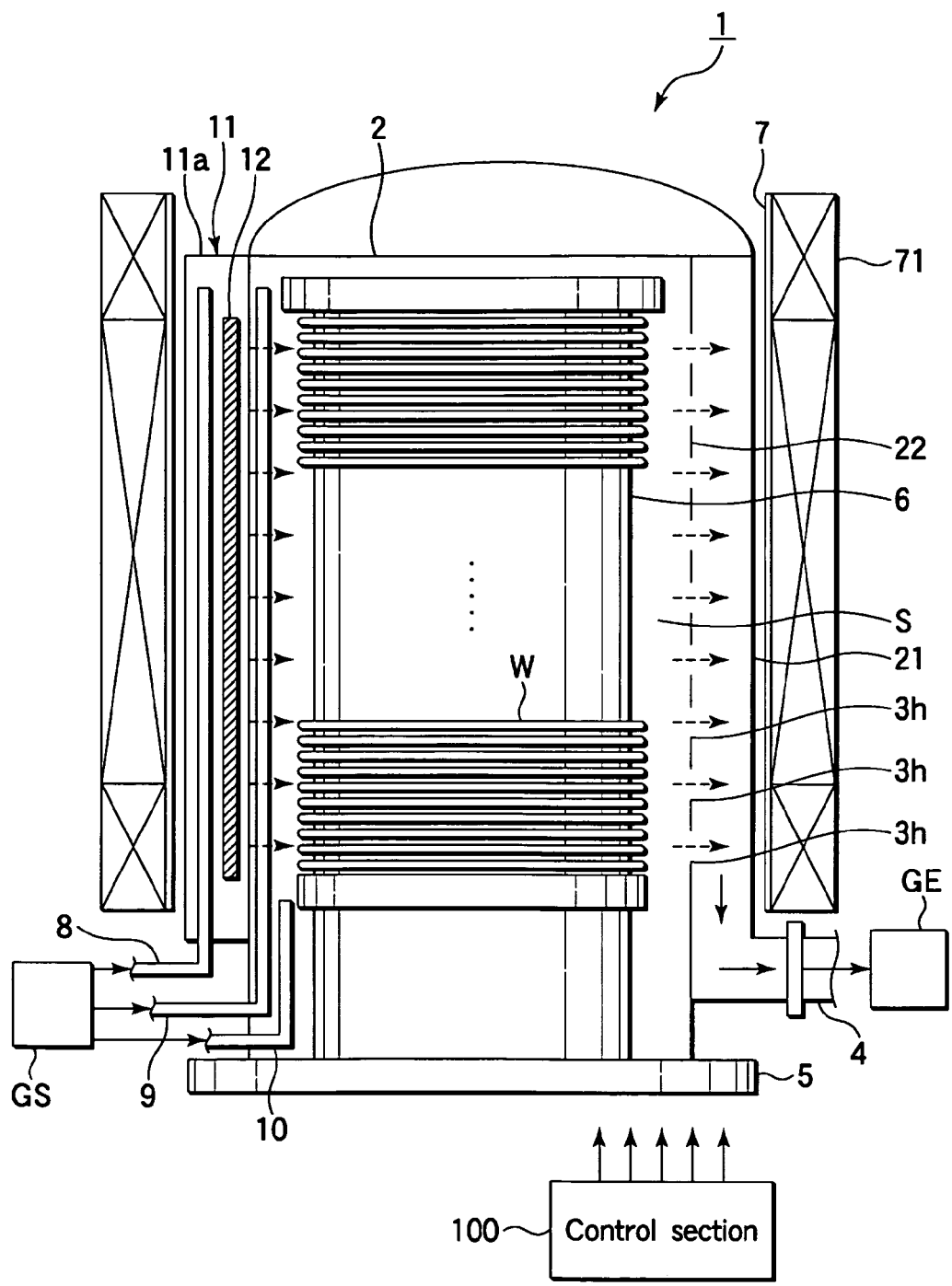
FIG. 1 is a sectional view showing a film formation apparatus (vertical CVD apparatus) according to an embodiment of the present invention.

In the process of developing the present invention, the inventors studied problems with regard to conventional methods for using a film formation apparatus for a semiconductor process, where the methods include a cleaning process for a reaction chamber. As a result, the inventors have arrived at the findings given below.

Specifically, film formation apparatuses of this kind entail deposition of by-product films (reaction products) not only inside a reaction tube but also inside a film formation gas nozzle (injector) for supplying a film formation gas. As regards by-product films deposited inside a reaction tubes, a cleaning process is performed to remove them as in a conventional method of using a film formation apparatus disclosed in, e.g., Jpn. Pat. Appln. KOKAI Publication No. 3-293726 described above. On the other hand, as regards by-product films deposited inside a film formation gas nozzle, the nozzle is detached from the apparatus and subjected to a separate cleaning process in a predetermined cycle. This requires work operations for detaching the film formation gas nozzle, manually cleaning the nozzle, and then reattaching and adjusting the nozzle. Further, the film formation apparatus needs to be shut down for a long time, thereby increasing the downtime of the apparatus and lowering the operating rate thereof. On the other hand, where the cycle of a cleaning process for the film formation gas nozzle is prolonged to decrease the downtime, particles can be more easily generated.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Figure 2:
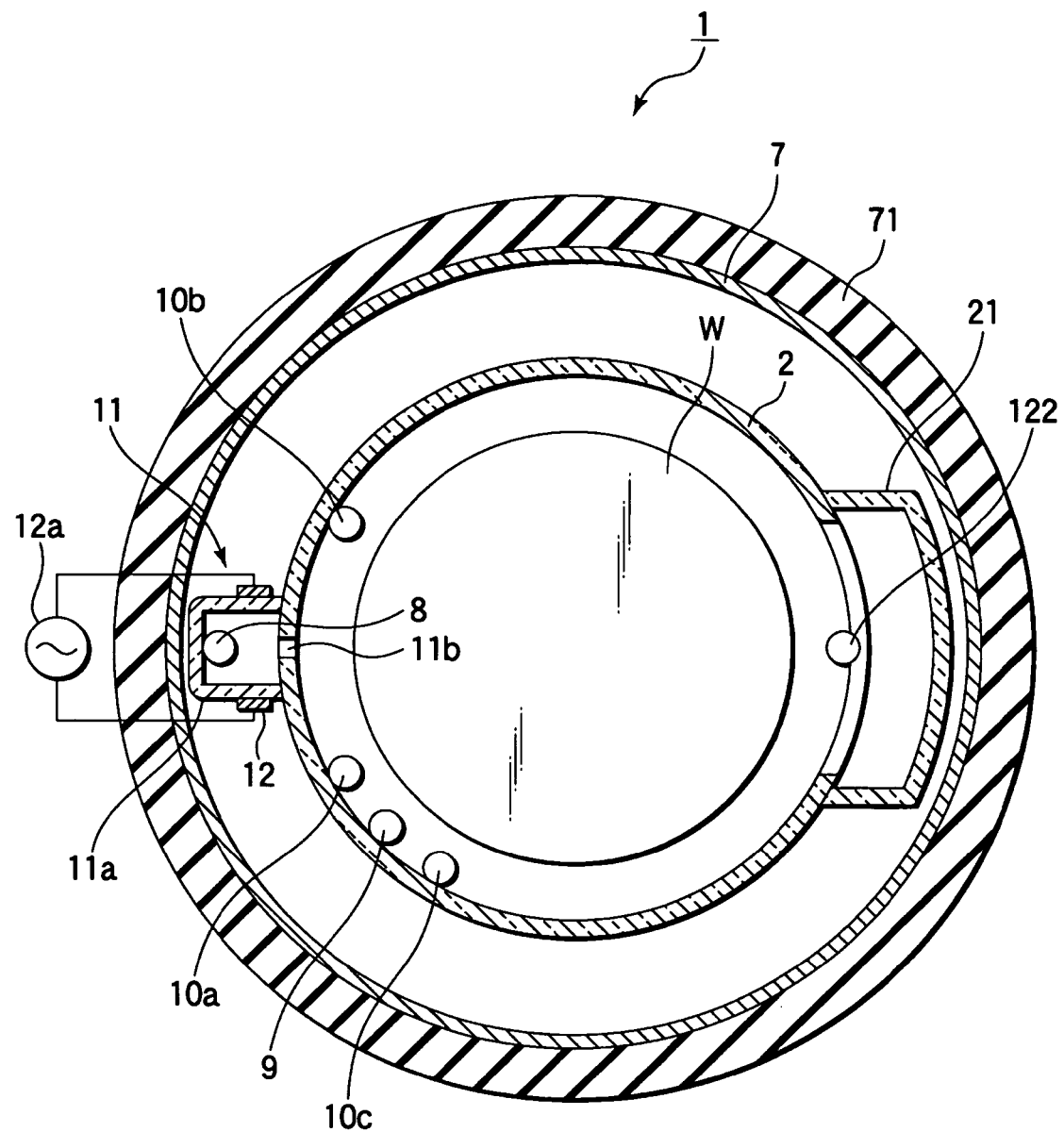
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. This film formation apparatus is structured as a vertical processing apparatus of the batch type for forming a silicon nitride film on a plurality of wafers W by MLD (Molecular Layer Deposition).

As shown in FIG. 1, the film formation apparatus 1 includes an essentially cylindrical reaction tube (reaction chamber) 2 arranged such that its top is closed and the longitudinal direction is set in the vertical direction. The reaction tube 2 forms a process space S therein for accommodating and processing a plurality of semiconductor wafers. The reaction tube 2 is made of a heat-resistant and corrosion-resistant material, such as quartz.

The reaction tube 2 is provided with an exhaust space 21 that extends in a vertical direction along the reaction tube 2 on one side for exhausting gas from inside the reaction tube 2. The process space S and exhaust space 21 are partitioned by a partition wall 22, and a plurality of exhaust holes 3h are formed in the partition wall 22 at predetermined intervals in the vertical direction at positions corresponding to the process space S. The exhaust holes 3h are used as an exhaust port that allows the process space S to communicate with the exhaust space 21.

The lower end of the exhaust space 21 is connected to an exhaust section GE through an airtight exhaust line 4 attached to the sidewall of the reaction tube 2 near the bottom. The exhaust section GE has a pressure adjusting mechanism including, e.g., a valve and a vacuum exhaust pump (not shown in FIG. 1, but shown in FIG. 3 with a reference symbol 127). The exhaust section GE is used to exhaust the atmosphere within the reaction tube 2, and set it at a predetermined pressure (vacuum level).

A lid 5 is disposed below the reaction tube 2. The lid 5 is made of a heat-resistant and corrosion-resistant material, such as quartz. The lid 5 is moved up and down by a boat elevator described later (not shown in FIG. 1, but shown in FIG. 3 with a reference symbol 128). When the lid 5 is moved up by the boat elevator, the bottom of the reaction tube 2 (load port) is closed. When the lid 5 is moved down by the boat elevator, the bottom of the reaction tube 2 (load port) is opened.

A wafer boat 6 made of, e.g., quartz is placed on the lid 5. The wafer boat 6 has a plurality of support levels to respectively hold a plurality of semiconductor wafers W at predetermined intervals in the vertical direction. A thermally insulating cylinder may be disposed on the lid 5 to prevent the temperature inside the reaction tube 2 from being lowered due to the load port of the reaction tube 2. Further, a rotary table may be disposed to rotatably mount thereon the wafer boat 6 that holds semiconductor wafers W. In this case, the temperature of the semiconductor wafers W placed on the wafer boat 6 can be more uniform.

The reaction tube 2 is surrounded by a thermally insulating cover 71 and a heater 7 made of, e.g., a resistive heating body is disposed on the inner surface of the cover 71. The interior of the reaction tube 2 is heated by the heater 7, so that the semiconductor wafers W are heated up (increase in temperature) to a predetermined temperature.

Gas distribution nozzles 8 and 9 and gas nozzles 10 penetrate the sidewall of the reaction tube 2 near the bottom, and are used for supplying process gases (such as film formation gases, a cleaning gas, and an inactive gas for dilution, purge, or pressure control) into the reaction tube 2. Each of the gas distribution nozzles 8 and 9 and gas nozzles 10 is connected to a process gas supply section GS through a mass-flow controller (MFC) and so forth (not shown). The process gas supply section GS includes gas sources of reactive gases and a gas source of nitrogen ($N_2$) gas used as an inactive gas, so as to prepare film formation gases and a cleaning gas, as follows.

Specifically, in this embodiment, in order to form a silicon nitride film (product film) on semiconductor wafers W by CVD, a first film formation gas containing a silane family gas and a second film formation gas containing a nitriding gas are used. In this embodiment, the silane family gas is dichlorosilane (DCS: $SiH_2Cl_2$) gas and the nitriding gas is ammonia ($NH_3$) gas. Each of the first and second film formation gases is mixed with a suitable amount of carrier gas (dilution gas, such as $N_2$ gas). However, such a carrier gas will be mentioned, only when necessary, for the sake of simplicity of explanation.

As a cleaning gas for etching by-product films which contain silicon nitride as the main component (it means 50% or more), a halogen-containing acidic gas or a mixture gas of a halogen gas and hydrogen gas is used. In this embodiment, the cleaning gas is a mixture gas of fluorine ($F_2$) gas and hydrogen fluoride (HF) gas used as cleaning reactive gases and nitrogen gas used as a dilution gas.

The gas distribution nozzle 8 is connected to gas sources of $NH_3$ gas and $N_2$ gas. The gas distribution nozzle 9 is connected to gas sources of DCS gas and $N_2$ gas. The gas nozzles 10 consist of three gas nozzles 10a, 10b, and 10c, wherein the gas nozzle 10a is connected to gas sources of $F_2$ gas and $N_2$ gas, the gas nozzle 10b is connected to gas sources of HF gas and $N_2$ gas, and the gas nozzle 10c is connected to a gas source of $N_2$ gas. A gas nozzle exclusively used for a purge gas (such as, $N_2$ gas) may be additionally disposed.

Each of the gas distribution nozzles 8 and 9 is formed of a quartz pipe which penetrates the sidewall of the reaction tube 2 from the outside and then turns and extends upward (see FIG. 1). Each of the gas distribution nozzles 8 and 9 has a plurality of gas spouting holes, each set of holes being formed at predetermined intervals in the longitudinal direction (the vertical direction) over all the wafers W on the wafer boat 6. Each set of the gas spouting holes delivers the corresponding process gas almost uniformly in the horizontal direction, so as to form gas flows parallel with the wafers W on the wafer boat 6. On the other hand, each of the gas nozzles 10 (10a, 10b, 10c) is formed of a short quartz pipe, which penetrates the sidewall of the reaction tube 2 from the outside and then turns and extends upward (see FIG. 1). Accordingly, the cleaning gas from the gas nozzles 10 is supplied into the reaction tube 2 from the bottom of the reaction tube 2 toward the top of the reaction tube 2.

A plasma generation section 11 is attached to the sidewall of the reaction tube 2 and extends in the vertical direction. The plasma generation section 11 has a vertically long narrow opening 11b formed by cutting a predetermined width of the sidewall of the reaction tube 2, in the vertical direction. The opening 11b is covered with a quartz cover 11a airtightly connected to the outer surface of the reaction tube 2 by welding. The cover 11a has a vertically long narrow shape with a concave cross-section, so that it projects outward from the reaction tube 2.

With this arrangement, the plasma generation section 11 is formed such that it projects outward from the sidewall of the reaction tube 2 and is opened on the other side to the interior of the reaction tube 2. In other words, the inner space of the plasma generation section 11 communicates with the process space S within the reaction tube 2. The opening 11b has a vertical length sufficient to cover all the wafers W on the wafer boat 6 in the vertical direction.

A pair of long narrow electrodes 12 are disposed on the opposite outer surfaces of the cover 11a, and face each other while extending in the longitudinal direction (the vertical direction). The electrodes 12 are connected to an RF (Radio Frequency) power supply 12a for plasma generation, through feed lines. An RF voltage of, e.g., 13.56 MHz is applied to the electrodes 12 to form an RF electric field for exciting plasma between the electrodes 12. The frequency of the RF voltage is not limited to 13.56 MHz, and it may be set at another frequency, e.g., 400 kHz.

The gas distribution nozzle 8 of the second film formation gas is bent outward in the radial direction of the reaction tube 2, at a position lower than the lowermost wafer W on the wafer boat 6. Then, the gas distribution nozzle 8 vertically extends at the deepest position (the farthest position from the center of the reaction tube 2) in the plasma generation section 11. As shown also in FIG. 2, the gas distribution nozzle 8 is separated outward from an area sandwiched between the pair of electrodes 12 (a position where the RF electric field is most intense), i.e., a plasma generation area where the main plasma is actually generated. The second film formation gas comprising $NH_3$ gas is spouted from the gas spouting holes of the gas distribution nozzle 8 toward the plasma generation area. Then, the second film formation gas is excited (decomposed or activated) in the plasma generation area, and is supplied in this state with radicals containing nitrogen atoms (N*, NH*, $NH_2$*, $NH_3$*) onto the wafers W on the wafer boat 6 (the symbol [*] denotes that it is a radical).

At a position near and outside the opening 11b of the plasma generation section 11, the gas distribution nozzle 9 for the first film formation gas is disposed. The gas distribution nozzle 9 extends vertically upward on one side of the outside of the opening 11b (inside the reaction tube 2). The first film formation gas comprising DCS gas is spouted from the gas spouting holes of the gas distribution nozzle 9 toward the center of the reaction tube 2.

Further, at nearer positions outside the opening 11b of the plasma generation section 11, the two gas nozzles 10a and 10b for the cleaning gas are disposed one on either side of the opening 11b. The gas nozzles 10a and 10b are arranged such that fluorine ($F_2$) gas is supplied from the gas nozzle 10a while hydrogen fluoride (HF) gas is supplied from the gas nozzle 10b. Further, at a position more distant from the opening 11b of the plasma generation section 11, the gas nozzle 10c for supplying nitrogen gas is disposed. Each of the gas nozzles 10 (10a, 10b, 10c) has an L-shape with a gas supply port at the top, which is directed upward.

A plurality of temperature sensors 122, such as thermocouples, for measuring the temperature inside the reaction tube 2 and a plurality of pressure gages (not shown in FIG. 1, but shown in FIG. 3 with a reference symbol 123) for measuring the pressure inside the reaction tube 2 are disposed inside the reaction tube 2.

Figure 3:
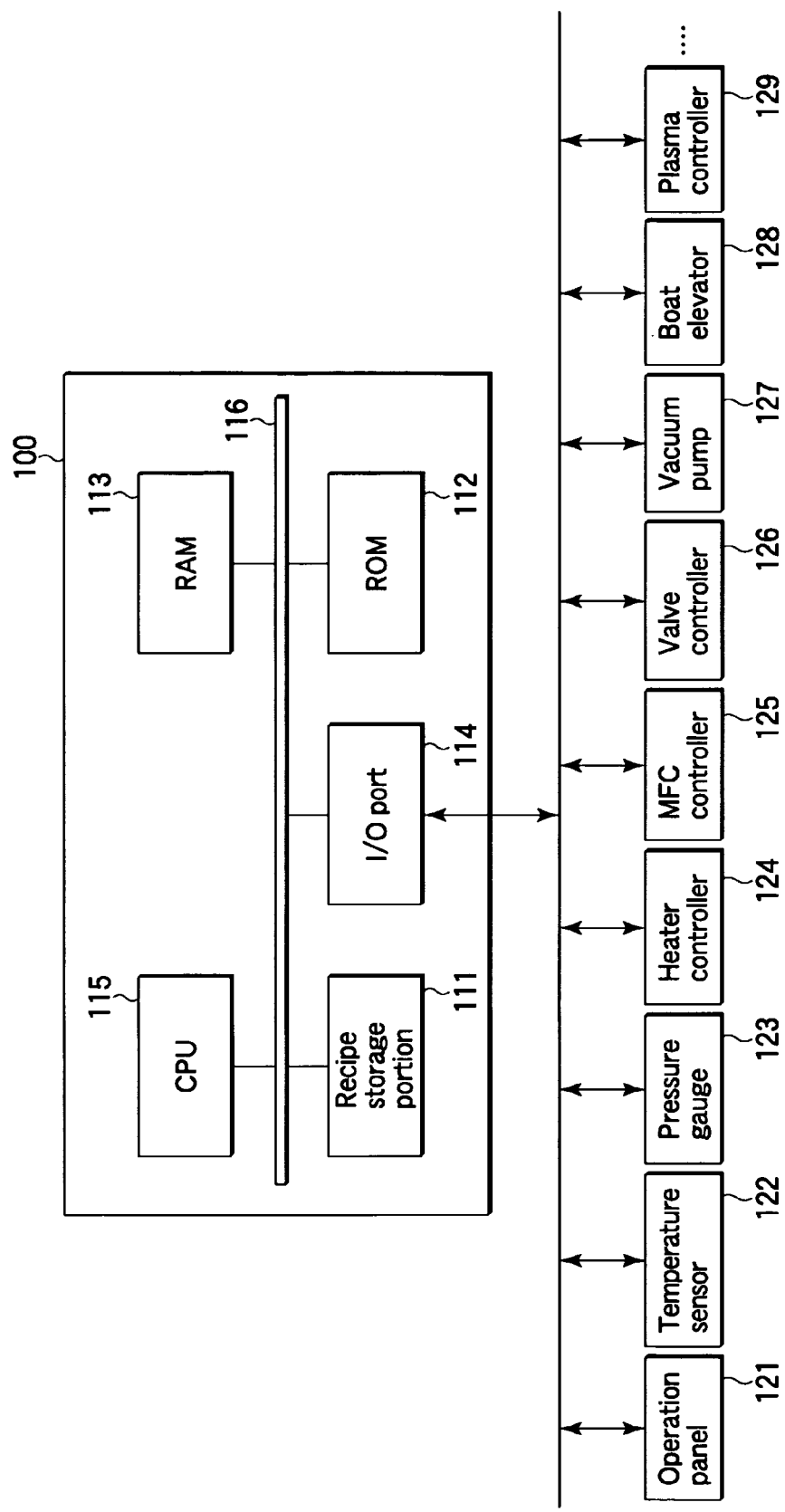
FIG. 3 is a view showing the structure of the control section of the apparatus shown in FIG. 1.

The film formation apparatus 1 further includes a control section 100 for controlling respective portions of the apparatus. FIG. 3 is a view showing the structure of the control section 100. As shown in FIG. 3, the control section 100 is connected to an operation panel 121, (a group of) temperature sensors 122, (a group of) pressure gages 123, a heater controller 124, MFC controllers 125, valve controllers 126, a vacuum pump 127, a boat elevator 128, a plasma controller 129, and so forth.

The operation panel 121 includes a display screen and operation buttons, and is configured to transmit operator's instructions to the control section 100, and show various data transmitted from the control section 100 on the display screen. The (group of) temperature sensors 122 are configured to measure the temperature at respective portions inside the reaction tube 2, exhaust line 4, and so forth, and to transmit measurement values to the control section 100. The (group of) pressure gages 123 are configured to measure the pressure at respective portions inside the reaction tube 2, exhaust line 4, and so forth, and to transmit measurement values to the control section 100.

The heater controller 124 is configured to control the heater 7. The heater controller 124 turns on the heater to generate heat in accordance with instructions from the control section 100. Further, the heater controller 124 measures the power consumption of the heater, and transmits it to the control section 100.

The MFC controllers 125 are configured to respectively control the MFCs (not shown) disposed on the gas distribution nozzles 8 and 9 and the gas nozzles 10. The MFC controllers 125 control the flow rates of gases flowing through the MFCs in accordance with instructions from the control section 100. Further, the MFC controllers 125 measure the flow rates of gases flowing through the MFCs, and transmit them to the control section 100.

The valve controllers 126 are respectively disposed on piping lines and configured to control the opening rate of valves disposed on piping lines in accordance with instructed values received from the control section 100. The vacuum pump 127 is connected to the exhaust line 4 and configured to exhaust gas from inside the reaction tube 2.

The boat elevator 128 is configured to move up the lid 5, so as to load the wafer boat 6 (semiconductor wafers W) into the reaction tube 2. The boat elevator 128 is also configured to move the lid 5 down, so as to unload the wafer boat 6 (semiconductor wafers W) from the reaction tube 2.

The plasma controller 129 is configured to control the plasma generation section 11 in accordance with instructions from the control section 100, so that ammonia supplied into the plasma generation section 11 is activated to generate ammonia radicals.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 1 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a storage medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFC controllers 125, valve controllers 126, vacuum pump 127, boat elevator 128, and plasma controller 129, and is configured to control output/input of data or signals.

The CPU (Central Processing Unit) 115 is the hub of the control section 100. The CPU 115 is configured to run control programs stored in the ROM 112, and control an operation of the film formation apparatus 1, in accordance with a recipe (process recipe) stored in the recipe storage portion 111, following instructions from the operation panel 121. Specifically, the CPU 115 causes the (group of) temperature sensors 122, (group of) pressure gages 123, and MFC controllers 125 to measure temperatures, pressures, and flow rates at respective portions inside the reaction tube 2, exhaust line 4, and so forth. Further, the CPU 115 outputs control signals, based on measurement data, to the heater controller 124, MFC controllers 125, valve controllers 126, and vacuum pump 127, to control the respective portions mentioned above in accordance with a process recipe.

Figure 4:
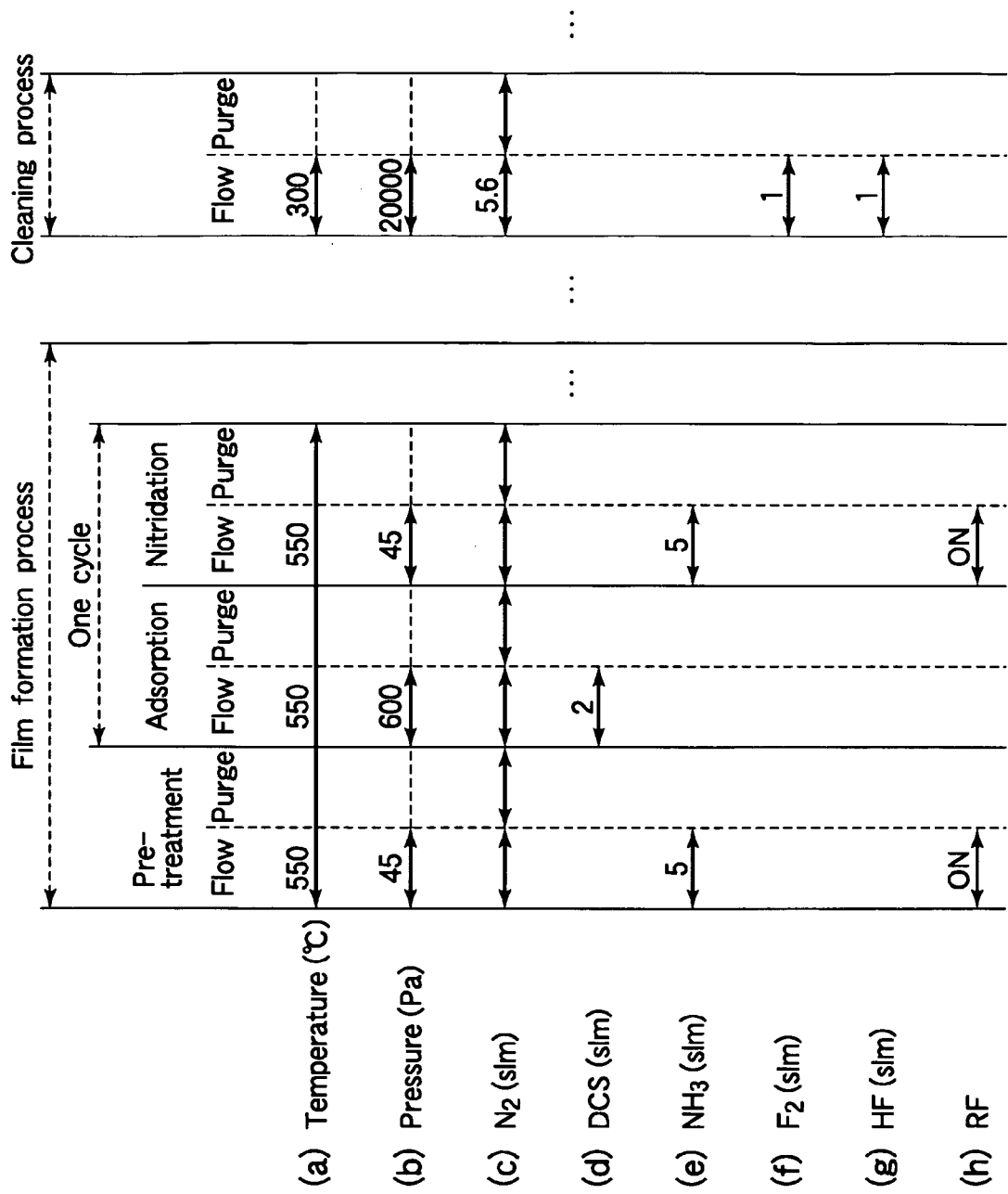
FIG. 4 is a timing chart showing the recipe of a film formation process and a cleaning process according to the embodiment of the present invention.

Next, an explanation will be given of a method for using the film formation apparatus 1 described above, with reference to FIG. 4. In outline, at first, a film formation process is performed to form a silicon nitride film on semiconductor wafers W inside the reaction tube 2. Then, a cleaning process is performed to remove by-product films, which contain silicon nitride as the main component (it means 50% or more), deposited inside the reaction tube 2 and inside the gas distribution nozzle 9. FIG. 4 is a timing chart showing the recipe of a film formation process and a cleaning process according to the embodiment of the present invention.

The respective components of the film formation apparatus 1 described below are operated under the control of the control section 100 (CPU 115). The temperature and pressure inside the reaction tube 2 and the gas flow rates during the processes are set in accordance with the recipe shown in FIG. 4, while the control section 100 (CPU 115) controls the heater controller 124 (for the heater 7), MFC controllers 125 (for the gas distribution nozzles 8 and 9 and gas nozzles 10), valve controllers 126, and vacuum pump 127, as described above.

<Film Formation Process>

At first, the wafer boat 6 at room temperature, which supports a number of, e.g., 50 to 100, wafers having a diameter of 300 mm, is loaded into the reaction tube 2 heated at a predetermined temperature, and the reaction tube 2 is airtightly closed. Then, the interior of the reaction tube 2 is vacuum-exhausted and kept at a predetermined process pressure, and the wafer temperature is increased to a process temperature for film formation. At this time, the apparatus is in a waiting state until the pressure and temperature become stable. Then, a pre-treatment stage is performed to treat the surface of the wafers W by ammonia radicals, as described below. During the film formation process comprising the pre-treatment stage as well as adsorption and nitridation stages alternately repeated thereafter, the wafer boat 6 is preferably kept rotated by the rotary table.

In the pre-treatment stage, at first, nitrogen gas is supplied from the gas distribution nozzle 9 into the reaction tube 2 at a predetermined flow rate, as shown in FIG. 4, (c). Further, the reaction tube 2 is set at a predetermined temperature, such as 550° C., as shown in FIG. 4, (a). At this time, the reaction tube 2 is exhausted to set the reaction tube 2 at a predetermined pressure, such as 45 Pa (0.34 Torr: 133 Pa=1 Torr), as shown in FIG. 4, (b). These operations are continued until the reaction tube 2 is stabilized at the predetermined pressure and temperature.

When the reaction tube 2 is stabilized at the predetermined pressure and temperature, an RF power is applied between the electrodes 12 (RF: ON), as shown in FIG. 4, (h). Further, ammonia gas is supplied from the gas distribution nozzle 8 to a position between the electrodes 12 (inside the plasma generation section 11) at a predetermined flow rate, such as 5 slm (standard liter per minute), as shown in FIG. 4, (e). Ammonia gas thus supplied is excited (activated) into plasma between the electrodes 12 (inside the plasma generation section 11) and generates ammonia radicals. The radicals thus generated are supplied from the plasma generation section 11 into the reaction tube 2. Further, nitrogen gas is also supplied from the gas distribution nozzle 9 into the reaction tube 2 at a predetermined flow rate, as shown in FIG. 4, (c) (flow step).

In the pre-treatment stage, when the pre-treatment is performed on the surface of the wafers W by ammonia radicals, —OH groups and —H groups present on the surface of the wafers W are partly replaced with —NH$_2$ groups. Accordingly, when the adsorption stage performed thereafter is started, —NH$_2$ groups are present on the surface of the wafers W. When DCS is supplied in this state, the DCS is thermally activated and reacts with —NH$_2$ groups on the surface of the wafers W, thereby accelerating adsorption of Si on the surface of the wafers W.

After ammonia gas is supplied for a predetermined time period, the supply of ammonia gas is stopped and the application of RF power is stopped. Further, the supply of nitrogen gas from the gas distribution nozzle 9 is stopped. Then, the reaction tube 2 is exhausted while nitrogen gas is supplied into the reaction tube 2 at a predetermined flow rate, as shown in FIG. 4, (c), to exhaust gas from inside the reaction tube 2 (purge step).

It should be noted that, in light of the film formation sequence, the temperature inside the reaction tube 2 is preferably set to be constant during the film formation. Accordingly, in this embodiment, the temperature inside the reaction tube 2 is set at 550° C. over the pre-treatment, adsorption, and nitridation stages. Further, the reaction tube 2 is kept exhausted over the pre-treatment, adsorption, and nitridation stages.

In the adsorption stage subsequently performed, at first, while nitrogen gas is supplied from the gas distribution nozzle 9 into the reaction tube 2 at a predetermined flow rate, as shown in FIG. 4, (c), the reaction tube 2 is set at a predetermined temperature, such as 550° C., as shown in FIG. 4, (a). At this time, the reaction tube 2 is exhausted to set the reaction tube 2 at a predetermined pressure, such as 600 Pa (4.6 Torr), as shown in FIG. 4, (b). These operations are continued until the reaction tube 2 is stabilized at the predetermined pressure and temperature.

When the reaction tube 2 is stabilized at the predetermined pressure and temperature, DCS gas is supplied at a predetermined flow rate, such as 2 slm, as shown in FIG. 4, (d), and nitrogen gas is also supplied at a predetermined flow rate, as shown in FIG. 4, (c), both from the gas distribution nozzle 9 into the reaction tube 2 (flow step). DCS gas thus supplied into reaction tube 2 is heated and thereby activated in the reaction tube 2, and reacts —NH$_2$ groups present on the surface of the wafers W to form an adsorption layer containing Si on the surface of the wafers W.

After DCS gas is supplied for a predetermined time period, the supply of DCS gas and nitrogen gas from the gas distribution nozzle 9 is stopped. Then, the reaction tube 2 is exhausted while nitrogen gas is supplied into the reaction tube 2 at a predetermined flow rate, as shown in FIG. 4, (c), to exhaust gas from inside the reaction tube 2 (purge step).

In the nitridation stage subsequently performed, at first, while nitrogen gas is supplied from the gas distribution nozzle 9 into the reaction tube 2 at a predetermined flow rate, as shown in FIG. 4, (c), the reaction tube 2 is set at a predetermined temperature, such as 550° C., as shown in FIG. 4, (a). At this time, the reaction tube 2 is exhausted to set the reaction tube 2 at a predetermined pressure, such as 45 Pa (0.34 Torr), as shown in FIG. 4, (b). These operations are continued until the reaction tube 2 is stabilized at the predetermined pressure and temperature.

When the reaction tube 2 is stabilized at the predetermined pressure and temperature, an RF power is applied between the electrodes 12 (RF: ON), as shown in FIG. 4, (h). Further, ammonia gas is supplied from the gas distribution nozzle 8 to a position between the electrodes 12 (inside the plasma generation section 11) at a predetermined flow rate, such as 5 slm, as shown in FIG. 4, (e). Ammonia gas thus supplied is excited (activated) into plasma between the electrodes 12 and generates radicals containing nitrogen atoms (N*, NH*, NH$_2$*, NH$_3$*). The radicals containing nitrogen atoms thus generated are supplied from the plasma generation section 11 into the reaction tube 2. Further, nitrogen gas is also supplied from the gas distribution nozzle 9 into the reaction tube 2 at a predetermined flow rate, as shown in FIG. 4, (c) (flow step).

The radicals flow out from the opening 11b of the plasma generation section 11 toward the center of the reaction tube 2, and are supplied into gaps between the wafers W in a laminar flow state. When radicals containing nitrogen atoms are supplied onto the wafers W, they react with Si in the adsorption layer on the wafers W, and a thin film of silicon nitride is thereby formed on the wafers W.

After ammonia gas is supplied for a predetermined time period, the supply of ammonia gas from the gas distribution nozzle 8 is stopped and the application of RF power is stopped. Further, the supply of nitrogen gas from the gas distribution nozzle 9 is stopped. Then, the reaction tube 2 is exhausted while nitrogen gas is supplied into the reaction tube 2 at a predetermined flow rate, as shown in FIG. 4, (c), to exhaust gas from inside the reaction tube 2 (purge step).

As described above, the film formation method according to this embodiment uses MLD (Molecular Layer Deposition) or ALD (Atomic Layer Deposition), which is one type of CVD, arranged to repeat a cycle alternately comprising adsorption and nitridation stages in this orders a predetermined number of times. In each cycle, DCS is supplied onto the wafers W to form an adsorption layer, and then radicals containing nitrogen atoms are supplied to nitride the adsorption layer, so as to form a silicon nitride film. As a result, a silicon nitride film of high quality can be formed with high efficiency.

When the silicon nitride film formed on the surface of the semiconductor wafers W reaches a predetermined thickness, the wafers W are unloaded. Specifically, nitrogen gas is supplied from the gas distribution nozzle 9 into the reaction tube 2 at a predetermined flow rate, so that the pressure inside the reaction tube 2 is returned to atmospheric pressure, and the reaction tube 2 is set at a predetermined temperature. Then, the lid 18 is moved down by the boat elevator 25, and the wafer boat 6 is thereby unloaded out of the reaction tube 2, along with the wafers W.

<Cleaning Process>

Repeating this film formation process a plurality of times, silicon nitride produced by the film formation process is deposited (adhered) not only on the surface of semiconductor wafers W, but also on portions inside the reaction tube 2, the gas distribution nozzle 9, and so forth, as by-product films. Accordingly, after the film formation process is repeated a predetermined number of times, a cleaning process is performed to remove by-product films which contain silicon nitride as the main component and are deposited inside the reaction tube 2, the gas distribution nozzle 9, and so forth.

At first, the reaction tube 2 is heated by the heater 7 at a predetermined load temperature, and nitrogen gas is supplied into the reaction tube 2 at a predetermined flow rate. Then, the wafer boat 6 used in the former process is set in an empty state with no wafers W supported thereon and is placed on the lid 5. Then, the lid 5 with this empty wafer boat 6 is moved up by the boat elevator 128, so that the wafer boat 6 is loaded into the reaction tube 2, and the reaction tube 2 is airtightly closed.

Then, nitrogen gas is supplied from the gas distribution nozzle 9 into the reaction tube 2 at a predetermined flow rate, as shown in FIG. 4, (c). Further, the interior of the reaction tube 2 is heated by the heater 7 to a predetermined temperature, such as 300° C., as shown in FIG. 4, (a). At this time, the interior of the reaction tube 2 is exhausted to set the interior of the reaction tube 2 at a predetermined pressure, such as 20,000 Pa (150 Torr), as shown in FIG. 4, (b). Then, fluorine gas and hydrogen fluoride gas used as cleaning reactive gases are supplied from the gas nozzles 10a and 10b into the reaction tube 2 at predetermined flow rates, and nitrogen gas used as a dilution gas is supplied from the other nozzles 8, 9, and 10c at predetermined flow rates (flow step).

FIG. 5 is a diagram showing the types and flow rates of gases supplied from the respective gas nozzles in the flow step of the cleaning process. Specifically, in this flow step, the fluorine gas is supplied from the gas nozzle 10a at 1 slm. The hydrogen fluoride gas is supplied from the gas nozzle 10b at 1 slm. The nitrogen gas is supplied at a total flow rate of 5.5 slm, such that it is supplied from the gas distribution nozzle 8 at 0.5 slm, from the gas distribution nozzle 9 at 0.5 slm, and from the gas nozzle 10c at 4.5 slm. In the flow step, the interior of the reaction tube 2 is kept exhausted by the exhaust section GE to maintain the pressure described above.

When the cleaning gas is supplied into the reaction tube 2, the cleaning gas is heated, and fluorine contained in the cleaning gas is activated, thereby forming a state in which a number of reactive free atoms are present. The activated fluorine comes into contact with (reacts with) by-product films deposited inside the reaction tube 2, and etches the by-product films.

Further, as regards a flow rate, which is a factor of determining the partial pressure of a gas supplied from each nozzle inside the reaction tube 2, the flow rate of nitrogen gas from the gas distribution nozzle 9 is smaller than those of gases from the other nozzles 8, 10a, 10b, and 10c. Consequently, activated fluorine preferentially flows into the gas distribution nozzle 9. The activated fluorine comes into contact with (reacts with) by-product films deposited inside the gas distribution nozzle 9, and etches the by-product films. At this time, since a small amount of nitrogen gas is supplied from the gas distribution nozzle 9, the activated fluorine does not make a deep inroad into the gas distribution nozzle 9 but stays near the gas spouting holes of the gas distribution nozzle 9 where by-product films tend to be easily deposited.

As described above, since by-product films deposited inside the gas distribution nozzle 9 are removed by etching along with by-product films deposited inside the reaction tube 2, there is no need to detach the gas distribution nozzle 9 from the apparatus and perform a separate cleaning process thereon in a predetermined cycle. Consequently, the downtime of the film formation apparatus 1 is decreased, and the film formation apparatus 1 can be thereby efficiently used. Further, a cleaning process inside the gas distribution nozzle 9 can be reliably performed in a short cycle used for the cleaning process inside reaction tube 2, and so the particle generation is suppressed in consequence.

In this flow step (etching step), the flow rate of nitrogen gas supplied from the gas distribution nozzle 9 is preferably set to be 1/15 to 1/200 of the total flow rate of the gases supplied into the reaction tube 2. Further, simultaneously with supply of fluorine gas from the gas nozzle 10a and supply of hydrogen fluoride gas from the gas nozzle 10b, nitrogen gas used as a dilution gas is preferably supplied from all the other nozzles 8, 9, and 10c. In this respect, the flow rate of nitrogen gas supplied from the gas distribution nozzle 9 is preferably set to be not larger than each of the flow rates of gases supplied from all the other nozzles 8, 10a, 10b, and 10c. Further, the flow rate of nitrogen gas supplied from the gas distribution nozzle 9 is preferably set to be smaller than each of the flow rates of fluorine gas supplied from the gas nozzle 10a and hydrogen fluoride gas supplied from the gas nozzle 10b.

In other words, in this flow step (etching step), the total pressure inside the reaction tube 2 is preferably set to be 6650 to 66500 Pa (50 to 500 Torr), and nitrogen gas supplied from the gas distribution nozzle 9 is preferably set to provide a partial pressure of 1/15 to 1/200 of the total pressure. In this respect, the partial pressure of nitrogen gas supplied from the gas distribution nozzle 9 is preferably set to be not larger than each of the partial pressures of gases supplied from all the other nozzles 8, 10a, 10b, and 10c. Further, each of the partial pressures of fluorine gas supplied from the gas nozzle 10a and hydrogen fluoride gas supplied from the gas nozzle 10b is preferably set to be ⅓ to ⅟₁₅ of the total pressure.

Where the conditions described above are satisfied, a cleaning process of the gas distribution nozzle 9 can be performed while the activated fluorine does not make a deep inroad into the gas distribution nozzle 9 but stays near the gas spouting holes of the gas distribution nozzle 9 where by-product films tend to be easily deposited.

After cleaning gas is supplied into the reaction tube 2 for a predetermined time period, the supply of fluorine gas and hydrogen fluoride gas from the gas nozzles 10a and 10b is stopped, and the supply of nitrogen gas from the gas nozzle 10c is stopped. Then, the reaction tube 2 is exhausted while nitrogen gas is supplied into the reaction tube 2 at a predetermined flow rate, as shown in FIG. 4, (c), to exhaust gas from inside the reaction tube 2 (purge step).

After the cleaning process is completed, nitrogen gas is supplied from the gas distribution nozzle 9 into the reaction tube 2 at a predetermined flow rate, so that the pressure inside the process tube 2 is returned to atmospheric pressure. Further, the temperature inside the reaction tube 2 is maintained by the heater 7 at a predetermined value. Then, the lid 5 is moved down by the boat elevator 128, so that the wafer boat 6 is unloaded and the reaction tube 2 is opened. Thereafter, the wafer boat 6 with a new lot of semiconductor wafers W mounted thereon is placed on the lid 5, and the film formation process is started again in the manner described above.

<Experiment>

An experiment was conducted to examine removal of by-product films deposited inside the reaction tube 2 and gas distribution nozzle 9 by performing a film formation process and a cleaning process in the film formation apparatus 1 shown in FIGS. 1 and 2. Specifically, the film formation process shown in FIG. 4 was performed to form a silicon nitride film on semiconductor wafers W, wherein reaction products, such as silicon nitride, were deposited inside the reaction tube 2 as by-product films having a thickness of 1 μm. Then, the cleaning process shown in FIG. 4 was performed to remove the by-product films deposited inside the reaction tube 2 and gas distribution nozzle 9. After the cleaning process, the wall surface of the reaction tube 2, the surface of the gas nozzles 10a and 10b, and the inner surface of the gas distribution nozzle 9 near the gas spouting holes were observed by use of pictures taken through a microscope. As a result, it was observed that the by-product films deposited inside the reaction tube 2 and gas distribution nozzle 9 were sufficiently removed. Further, it was not observed that the surface of the gas nozzles 10a and 10b was deteriorated. Hence, it has been confirmed that the method according to this embodiment can reliably remove by-product films deposited inside the reaction tube 2 and gas distribution nozzle 9.

<Consequence and Modification>

As described above, according to this embodiment, since by-product films deposited inside the gas distribution nozzle 9 are removed by etching along with by-product films deposited inside the reaction tube 2, there is no need to detach the gas distribution nozzle 9 from the apparatus and perform a separate cleaning process thereon in a predetermined cycle. Consequently, the downtime of the film formation apparatus 1 is decreased, and the film formation apparatus 1 can be thereby efficiently used. Further, a cleaning process inside the gas distribution nozzle 9 can be reliably performed in a short cycle used for the cleaning process inside reaction tube 2, and so the particle generation is suppressed in consequence.

In the embodiment described above, the flow rate of nitrogen gas supplied from the gas distribution nozzle 9 is set to be the smallest among the flow rates of gases supplied from all the nozzles 8, 9, 10a, 10b, and 10c, so that activated fluorine preferentially flows into the gas distribution nozzle 9. However, a cleaning process may be performed by use of other setting conditions, as long as activated fluorine can flow into the gas distribution nozzle 9.

In the embodiment described above, the etching step is arranged to cause activated fluorine to flow into only the gas distribution nozzle 9. However, the etching step may be arranged to cause activated fluorine to flow into other nozzles, such as the gas distribution nozzle 8, as well.

Figure 6:
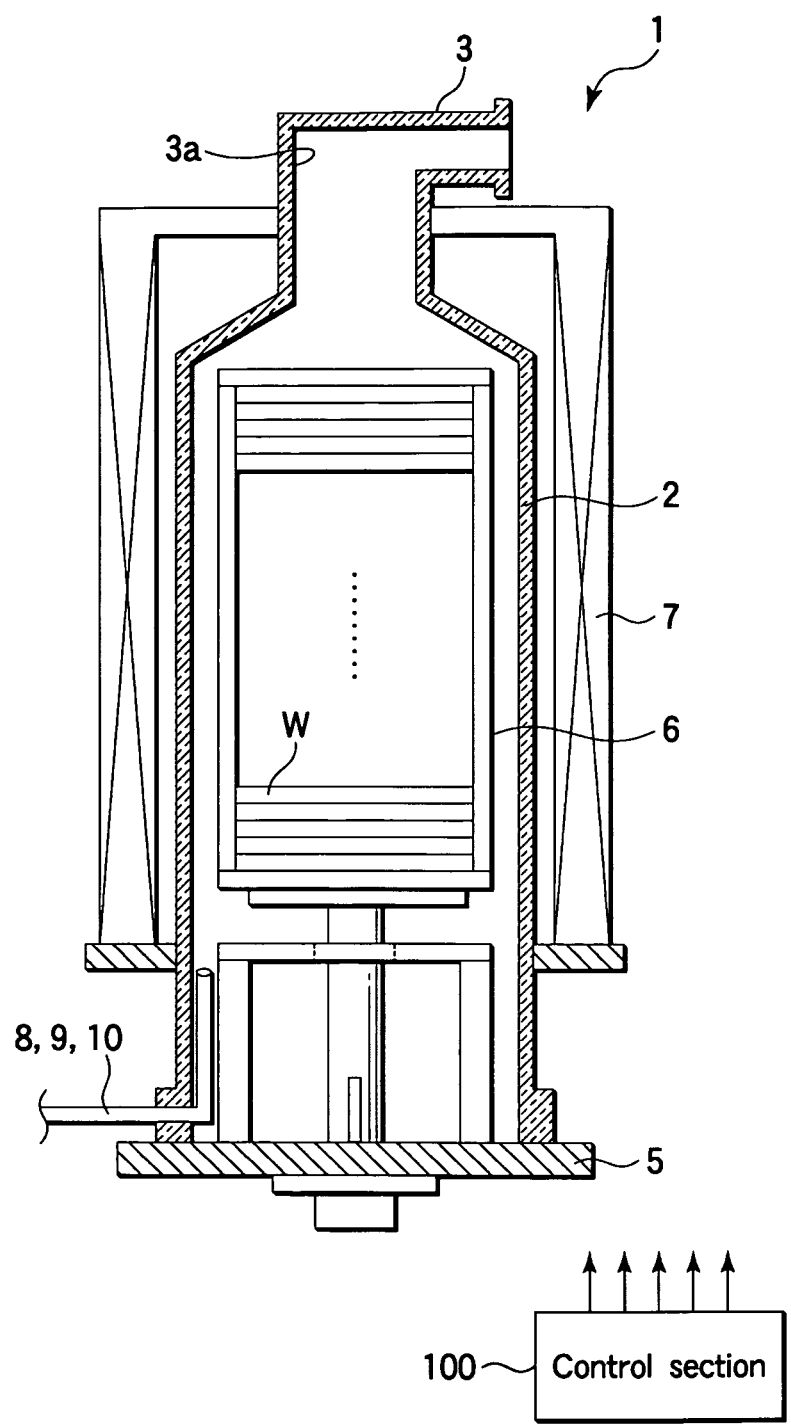
FIG. 6 is a sectional view showing a film formation apparatus (vertical CVD apparatus) according to a modification of the embodiment.

In the embodiment described above, an MLD or ALD method is used to form a silicon nitride film, but a thermal CVD method may be used to form a silicon nitride film, for example. FIG. 6 is a sectional view showing a film formation apparatus (vertical CVD apparatus) according to a modification of the embodiment. This film formation apparatus is structured to form a silicon nitride film by an ordinary thermal CVD without plasma assistance, while supplying the two film formation gases (a silane family gas and a nitriding gas) simultaneously with each other in place of pulse-wise alternate supply. Also in this apparatus, a cleaning process is performed inside the reaction tube 2 by use of setting conditions to cause activated fluorine to flow into a gas distribution nozzle 9 for supplying a silane family gas. With this arrangement, the apparatus shown in FIG. 6 can also exhibit an effect of the same kind as the apparatus shown in FIG. 1. Alternatively, the present invention may be applied to a horizontal film formation apparatus of the batch type or a film formation apparatus of the single-substrate type.

In the embodiment described above, the film formation apparatus 1 includes the plasma generation section 11. Alternatively, the present invention may be applied to a film formation apparatus including a gas activation section that utilizes another medium, such as a catalyst, UV, heat, or magnetic force. In the embodiment described above, the film formation apparatus 1 is designed to form a silicon nitride film. Alternatively, the present invention may be applied to a film formation apparatus designed to form another thin film, such as a silicon oxide film, silicon oxynitride film, or polysilicon film.

In the embodiment described above, the cleaning gas for etching by-product films which contain silicon nitride as the main component (it means 50% or more) comprises a gas containing fluorine gas and hydrogen fluoride gas. However, the cleaning gas may be any gas, such as a gas containing fluorine gas and hydrogen gas, as long as it can remove a by-product film deposited due to a film formation process.

In the embodiment described above, nitrogen gas is supplied as a dilution gas when each of the process gases, such as DCS gas, is supplied. In this respect, no nitrogen gas may be supplied when each of the process gases is supplied. However, each of the process gases preferably contains nitrogen gas as a dilution gas, because the process time can be more easily controlled if it is so arranged. The dilution gas consists preferably of an inactive gas, such as nitrogen gas, or helium gas (He), neon gas (Ne), argon gas (Ar), or xenon gas (Xe) in place of nitrogen gas.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A method for using a film formation apparatus for a semiconductor process to form a thin film of a compound of silicon and a secondary element on a plurality of target substrates while supplying a film formation gas containing a silicon source gas from a gas distribution nozzle with a plurality of gas spouting holes formed thereon at predetermined intervals in a vertical direction and supplying a secondary film formation gas containing the secondary element from an additional film formation gas nozzle, both into a reaction chamber that accommodates the target substrates at intervals in a vertical direction, the method comprising:

setting the apparatus by disposing a cleaning gas nozzle opened at a bottom portion inside the reaction chamber and configured to supply a cleaning gas containing fluorine, and an inactive gas nozzle opened at a bottom portion inside the reaction chamber and configured to supply an inactive gas, and arranging the gas distribution nozzle and the additional film formation gas nozzle to supply the inactive gas;

then performing a first round of a film formation process for forming the thin film by CVD on a first lot of product target substrates inside the reaction chamber, the film formation process supplying the film formation gas from the gas distribution nozzle into the reaction chamber and supplying the secondary film formation gas from the additional film formation gas nozzle into the reaction chamber;

then performing a second round of the film formation process for forming the thin film by CVD on a second lot of product target substrates inside the reaction chamber; and performing a cleaning process between the first and second rounds of the film formation process to remove a by-product film deposited inside the reaction chamber and the gas distribution nozzle, in a state where no product target substrates are accommodated inside the reaction chamber, without supplying the cleaning gas through the gas distribution nozzle into the reaction chamber between the first and second rounds of the film formation process, the cleaning process performing an etching step and an exhaust step in this order, the etching step:
supplying the cleaning gas from the cleaning gas nozzle into the reaction chamber at a first flow rate,
supplying the inactive gas from the gas distribution nozzle through the gas spouting holes into the reaction chamber at a second flow rate that is $1/15$ to $1/200$ of a total flow rate of gases supplied into the reaction chamber during cleaning,
supplying the inactive gas from the inactive gas nozzle into the reaction chamber at a third flow rate, and
supplying the inactive gas from the additional film formation gas nozzle into the reaction chamber at a fourth flow rate, while setting a total pressure in the reaction chamber from 6,650 to 66,500Pa (50 to 500 Torr), the second flow rate being smaller than either of the first and third flow rates and not larger than the fourth flow rate so that the cleaning gas is caused to flow from inside the chamber into the gas distribution nozzle through the gas spouting holes thereof and thereby etch the by-product film, the cleaning gas providing $1/3$ to $1/15$ of the total pressure, and the inactive gas from the gas distribution nozzle providing $1/15$ to $1/200$ of the total pressure, and the exhaust step stopping supply of the cleaning gas and exhausting gas from inside the reaction chamber.

2. The method according to claim 1, wherein said setting the apparatus further includes disposing an additional cleaning gas nozzle opened at a bottom portion inside the reaction chamber and configured to supply an additional cleaning gas, and the etching step further includes supplying the additional cleaning gas from the additional cleaning gas nozzle into the reaction chamber at a flow rate larger than the second flow rate.

3. The method according to claim 2, wherein the etching step supplies the additional cleaning gas to have a partial pressure of $1/3$ to $1/15$ of the total pressure.

4. The method according to claim 1, wherein the apparatus includes a plurality of nozzles communicating with the reaction chamber, and the second flow rate is not larger than each of the other flow rates of gases supplied from the plurality of nozzles in the etching step.

5. The method according to claim 1, wherein the exhaust system includes an exhaust port opposite to the gas distribution nozzle with the support member interposed therebetween and present in an area extending in a vertical direction.

6. The method according to claim 1, wherein the inactive gas is nitrogen gas.

7. The method according to claim 1, wherein the cleaning gas is either of fluorine gas and hydrogen fluoride gas.

8. The method according to claim 1, wherein the exhaust system includes an exhaust port opposite to the first gas distribution nozzle with the support member interposed therebetween and present in an area extending in a vertical direction.

9. A method for using a film formation apparatus for a semiconductor process to form a silicon nitride film,
the film formation apparatus including
a reaction chamber configured to accommodate a plurality of target substrates at intervals in a vertical direction,
a support member configured to support the target substrates inside the reaction chamber,
an exhaust system configured to exhaust gas from inside the reaction chamber,
a heater disposed around the reaction chamber to heat the target substrates,
a first film formation gas supply system configured to supply a first film formation gas containing a silicon source gas into the reaction chamber, the first film formation gas supply system including a first gas distribution nozzle with a plurality of gas spouting holes formed thereon at predetermined intervals in a vertical direction for supplying the first film formation gas,
a second film formation gas supply system configured to supply a second film formation gas containing a nitriding gas into the reaction chamber, the second film formation gas supply system including a second gas distribution nozzle with a plurality of gas spouting holes formed thereon at predetermined intervals in a vertical direction for supplying the second film formation gas, and
a plasma generation section attached outside the reaction chamber and forming a plasma generation space that communicates with a process space inside the reaction chamber, the second film formation gas from the second gas distribution nozzle being supplied through the plasma generation space into the process space, the method comprising:

setting the apparatus by disposing a cleaning gas nozzle opened at a bottom portion inside the reaction chamber and configured to supply a cleaning gas containing fluorine, and an inactive gas nozzle opened at a bottom portion inside the reaction chamber and configured to supply an inactive gas, and arranging the first and second gas distribution nozzles to supply the inactive gas;

then performing a first round of a film formation process for forming the silicon nitride film by atomic layer deposition on a first lot of product target substrates inside the reaction chamber, the film formation process alternately supplying the first film formation gas from the first gas distribution nozzle and the second film formation gas from the second gas distribution nozzle into the reaction chamber while activating the second film formation gas by the plasma generation section;

then performing a second round of the film formation process for forming the silicon nitride film by atomic layer deposition on a second lot of product target substrates inside the reaction chamber; and performing a cleaning process between the first and second rounds of the film formation process to remove a by-product film deposited inside the reaction chamber and the first gas distribution nozzle, in a state where no product target substrates are accommodated inside the reaction chamber, without supplying the cleaning gas through either of the first and second gas distribution nozzles into the reaction chamber between the first and second rounds of the film formation process, the cleaning process performing an etching step and an exhaust step in this order, the etching step:

supplying the cleaning gas from the cleaning gas nozzle into the reaction chamber at a first flow rate, supplying the inactive gas from the first gas distribution nozzle through the gas spouting holes thereof into the reaction chamber at a second flow rate that is $1/15$ to $1/200$ of a total flow rate of gases supplied into the reaction chamber during cleaning, supplying the inactive gas from the inactive gas nozzle into the reaction chamber at a third flow rate, and supplying the inactive gas from the second gas distribution nozzle through the gas spouting holes thereof into the reaction chamber at a fourth flow rate, while setting a total pressure in the reaction chamber from 6,650 to 66,500Pa (50 to 500 Torr), the second flow rate being smaller than either of the first and third flow rates and not larger than the fourth flow rate so that the cleaning gas is caused to flow from inside the chamber into the first gas distribution nozzle through the gas spouting holes thereof and thereby etch the by-product film, the cleaning gas providing $1/3$ to $1/15$ of the total pressure, and the inactive gas from the first gas distribution nozzle providing $1/15$ to $1/200$ of the total pressure, and the exhaust step stopping supply of the cleaning gas and exhausting gas from inside the reaction chamber.

10. The method according to claim 9, wherein the inactive gas is nitrogen gas.

11. The method according to claim 9, wherein said setting the apparatus further includes disposing an additional cleaning gas nozzle opened at a bottom portion inside the reaction chamber and configured to supply an additional cleaning gas, and the etching step further includes supplying an additional cleaning gas from the additional cleaning gas nozzle into the reaction chamber at a flow rate larger than the second flow rate.

12. The method according to claim 9, wherein the cleaning gas is either of fluorine gas and hydrogen fluoride gas.

13. The method according to claim 11, wherein the etching step supplies the additional cleaning gas to have a partial pressure of $1/3$ to $1/15$ of the total pressure.

14. The method according to claim 9, wherein the apparatus includes a plurality of nozzles communicating with the reaction chamber, and the second flow rate is not larger than each of the other flow rates of gases supplied from the plurality of nozzles in the etching step.

* * * * *